(12) United States Patent
Matsuya

(10) Patent No.: US 6,191,624 B1
(45) Date of Patent: Feb. 20, 2001

(54) VOLTAGE COMPARATOR

(75) Inventor: Yasuyuki Matsuya, Kanagawa (JP)

(73) Assignee: Nippon Telegraph and Telephone Corporation ( * ) Notice: Under 35 U.S.C. 154(b), the term of this patent shall be extended for 0 days.

(21) Appl. No.: 09/425,413

(22) Filed: Oct. 25, 1999

(30) Foreign Application Priority Data

Oct. 23, 1998 (JP) ................................................. 10-320021

(51) Int. Cl.[7] ...................................................... H03K 5/22
(52) U.S. Cl. ................................................ 327/77; 327/55
(58) Field of Search ................................... 327/51, 52, 54, 327/55, 56, 57, 60, 65, 67, 68, 69, 70, 72, 77–82, 89, 90, 562, 563

(56) References Cited

U.S. PATENT DOCUMENTS

| | | | |
|---|---|---|---|
| 5,162,681 | * | 11/1992 | Lee .................................. 365/189.11 |
| 5,192,878 | * | 3/1993 | Miyamoto et al. ..................... 327/55 |
| 5,438,287 | * | 8/1995 | Faue ........................................ 327/54 |
| 5,880,617 | * | 3/1999 | Tanaka et al. ........................ 327/333 |
| 5,949,256 | * | 9/1999 | Zhang et al. ............................ 327/57 |
| 6,008,673 | * | 12/1999 | Glass et al. .............................. 327/77 |

FOREIGN PATENT DOCUMENTS 7-154216    6/1995  (JP) .

* cited by examiner

Primary Examiner—My-Trang Nu Ton
(74) Attorney, Agent, or Firm—Blakely Sokoloff Taylor & Zafman

(57) ABSTRACT

In a voltage comparator, a positive feedback circuit having first and second inverters compares the potential of the input terminal of the first inverter with the potential of the input terminal of the second inverter and outputs the comparison result from the output terminal of the second inverter. A first input circuit supplies the first potential corresponding to an input comparison voltage to the input terminal of the second inverter. A second input circuit supplies the second potential corresponding to an input reference voltage to the input terminal of the first inverter. A control circuit supplies a power supply voltage to the positive feedback circuit when an input control signal represents a comparison operation period to execute voltage comparison operation. When the control signal represents an initialization period, the control circuit stops supplying the power supply voltage to set an initial state. A first reset circuit reduces the first potential to a ground potential when the control signal represents the initialization period. A second reset circuit reduces the second potential to the ground potential when the control signal represents the initialization period.

10 Claims, 6 Drawing Sheets

VOLTAGE COMPARATOR

BACKGROUND OF THE INVENTION

The present invention relates to a voltage comparator for comparing a reference voltage with a comparison voltage using field effect transistors.

Conventionally, as a voltage comparator for comparing a reference voltage with a comparison voltage using field effect transistors (FETs), a positive feedback type voltage comparator as shown in FIG. 7 has been proposed (e.g., Japanese Patent Laid-Open No. 7-154216). Referring to FIG. 7, a voltage comparator 201 is constructed by PMOS (P-channel Metal Oxide Semiconductor) field effect transistors T52 to T56, NMOS (N-channel Metal Oxide Semiconductor) field effect transistor T51, and inverters I51 to I54. The PMOS and NMOS field effect transistors will be simply referred to as "transistors" hereinafter unless otherwise specified.

The inverter I51 is formed from an NMOS transistor T61 and PMOS transistor T62. The inverter I52 is formed from an NMOS transistor T71 and PMOS transistor T72.

The power supply terminal of the inverter I51 is connected to that of the inverter I52. The transistor T51 is connected between the connection point of these power supply terminals and a power supply terminal 215 of a power supply voltage VDD. The ground terminal of the inverter I51 is connected to that of the inverter I52. The transistor T56 is connected between the connection point of these ground terminals and a ground terminal 216 of a ground voltage GND.

The output terminal of the inverter I51 is connected to an input terminal A of the inverter I52. The output terminal of the inverter I52 is connected to an input terminal B of the inverter I51. The inverters I51 and I52 construct a positive feedback circuit. The output terminal of the inverter I52 corresponds to an output terminal Vout of the positive feedback type voltage comparator 201.

The transistors T52 and T53 are series-connected between the input terminal A of the inverter I52 and the ground terminal 216. The gate of the transistor T52 corresponds to an input terminal 211 of a comparison voltage Vin.

The transistors T54 and T55 are connected between the input terminal B of the inverter I51 and the ground terminal 216. The gate of the transistor T54 corresponds to an input terminal 212 of a reference voltage Vref.

The input of the inverter I53 is connected to the input terminal A of the inverter I52. The output of the inverter I53 is connected to the gate of the transistor T53. The input of the inverter I54 is connected to the input terminal B of the inverter I51. The output of the inverter I54 is connected to the gate of the transistor T55.

In the voltage comparator 201 having such circuit arrangement, first, complementary control signals CLp and CLn are controlled to turn off the transistors T51 and T56, respectively. No current flows to the transistors T61, T62, T71, and T72, and the input terminals A and B are in the floating state. In the comparison operation, potentials for turning on the transistors T52 and T54 are supplied to the comparison voltage Vin and reference voltage Vref. For this reason, the input terminals A and B are discharged to the ground voltage GND via the transistors T52, T53, T54, and T55.

Next, the complementary control signals CLp and CLn are controlled to turn on the transistors T51 and T56, respectively. A current flows to the transistors T61, T62, T71, and T72, and the inverters I51 and I52 are rendered operative. This forms the positive feedback path of the positive feedback circuit comprising the inverters I51 and I52.

Immediately after the positive feedback path is formed, both the input terminals A and B are at the ground potential GND. Of the input terminals A and B, one having a higher ON resistance for the transistor T52 or T54 is set at the power supply potential VDD, and the other having a lower ON resistance is set at the ground potential GND. When the transistors T52 and T54 are NMOS transistors, as shown in FIG. 7, the ON resistance is in inverse proportion to the gate voltage. The relationship in magnitude between the ON resistances is equivalent to that between the comparison voltage Vin and reference voltage Vref. Hence, the comparison voltage Vin and reference voltage Vref can be compared with each other.

If potentials due to the previous comparison operation remain at the input terminals A and B, the comparison voltage Vin or reference voltage Vref input for the next voltage comparison has an error, and accurate voltage comparison is impossible. To prevent this, when voltage comparison is to be continuously performed, the voltage comparator 201 turns off the transistors T51 and T56 by controlling the control signals CLp and CLn to sufficiently discharge the input terminals A and B to the ground potential GND and then starts the next voltage comparison.

In this case, when the transistors T51 and T56 are turned off, charges stored in the line capacitances of the input terminals A and B are removed via the transistors T52, T53, T54, and T55. However, the ON resistances of the transistors T52 and T54 change depending on the values of the comparison voltage Vin and reference voltage Vref. When the ON resistances are high to some extent, a long time is required to reduce the potentials at the input terminals A and B to the ground potential GND to prepare for the next comparison operation. Hence, the comparison operation cannot be repeated at a high speed.

SUMMARY OF THE INVENTION

The present invention has been made to solve the above problem, and has as its object to provide a voltage comparator capable of continuously comparing a reference voltage and comparison voltage at a short time interval.

In order to achieve the above object, according to the present invention, there is provided a voltage comparator comprising a positive feedback circuit having first and second inverters each having an input terminal connected to an output terminal of the other inverter, the positive feedback circuit comparing a potential of an input terminal of the first inverter with a potential of an input terminal of the second inverter and outputting the comparison result from an output terminal of the second inverter, a first input circuit for supplying the first potential corresponding to an input comparison voltage to the input terminal of the second inverter, a second input circuit for supplying the second potential corresponding to an input reference voltage to the input terminal of the first inverter, a control circuit connected between a power supply terminal of the positive feedback circuit and a power supply terminal, the control circuit supplying a power supply voltage to the positive feedback circuit when an input control signal represents a comparison operation period to execute voltage comparison operation for comparing the first potential with the second potential by the positive feedback circuit, and stopping supplying the power supply voltage to set an initial state when the control signal represents an initialization period, a first reset circuit inserted between the input terminal of the second inverter and a ground terminal to reduce the first potential to a ground potential when the control signal represents the initialization period, and a second reset circuit inserted between the input terminal of the first inverter and the ground terminal to reduce the second potential to the ground potential when the control signal represents the initialization period.

DESCRIPTION OF THE PREFERRED EMBODIMENTS

The present invention will be described below with reference to the accompanying drawings.

Figure 1:
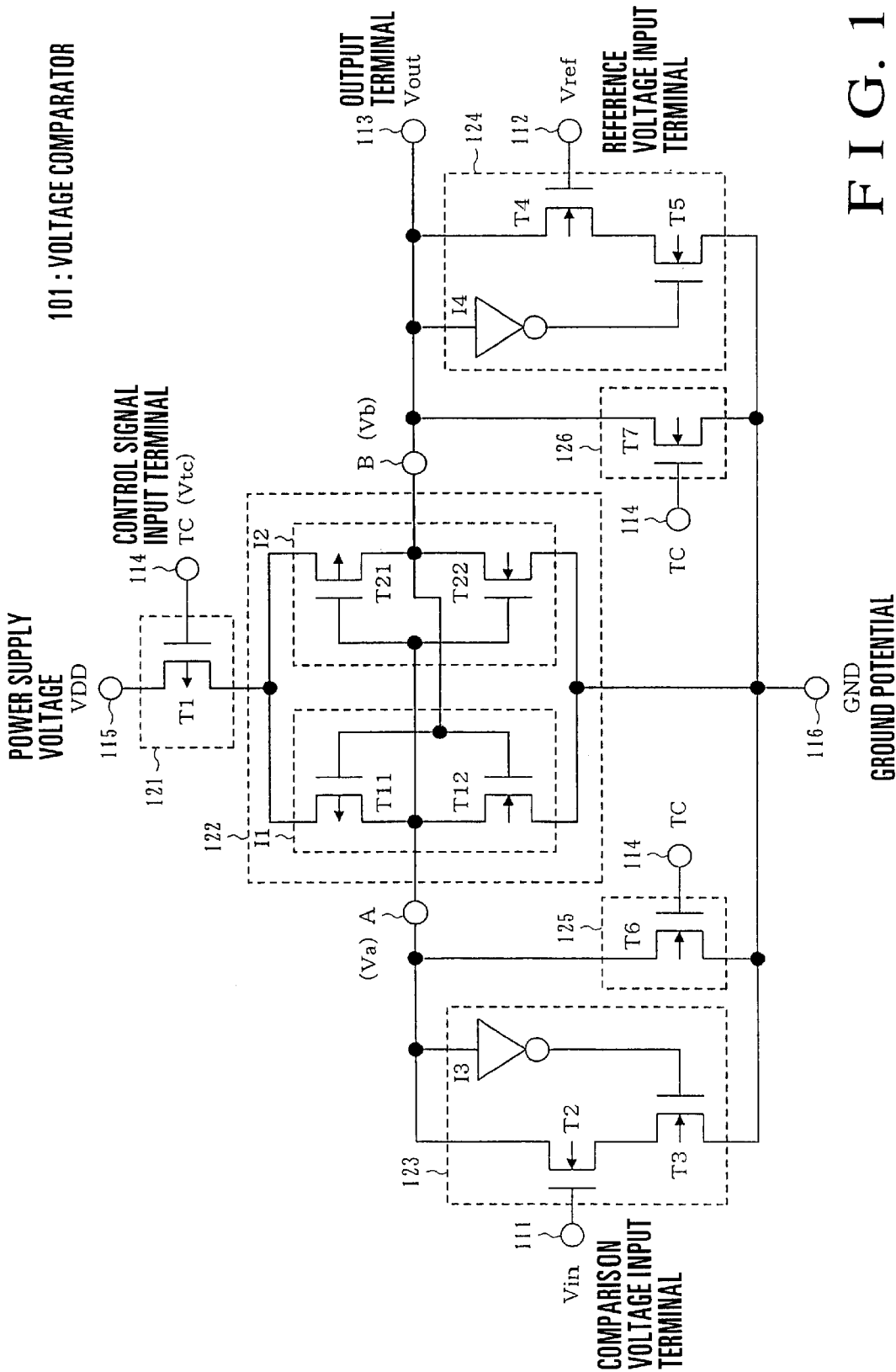
FIG. 1 is a circuit diagram showing a voltage comparator 101 according to the first embodiment of the present invention.

FIG. 1 shows a voltage comparator 101 according to the first embodiment of the present invention. The positive feedback type voltage comparator 101 is constructed by a PMOS field effect transistor T1, inverter I1 (first inverter) and inverter I2 (second inverter), NMOS field effect transistors T2 to T7, and inverter I3 (third inverter) and inverter I4 (fourth inverter). The PMOS field effect transistor (PMOSFET) and NMOS field effect transistor (NMOSFET) will be simply referred to as "transistors" hereinafter unless otherwise specified.

The inverter I1 comprises a PMOS field effect transistor T11 and NMOS field effect transistor T12. The inverter I2 comprises a PMOS field effect transistor T21 and NMOS field effect transistor T22. The output terminal of the inverter I1 is connected to an input terminal A of the inverter I2. The output terminal of the inverter I2 is connected to an input terminal B of the inverter I1. These inverters I1 and I2 form a positive feedback circuit 122.

The power supply terminal of the inverter I1 is connected to that of the inverter I2. The transistor T1 is series-connected between the connection point of the power supply terminals and a connection terminal 115 (power supply terminal) of a power supply voltage VDD. An input terminal 114 of a control signal TC is connected to the gate of the transistor T1. The transistor T1 forms a control circuit 121 for controlling power supply to the inverters I1 and I2.

The ground terminal of the inverter I1 is connected to that of the inverter I2. The connection point of the ground terminals is connected to a connection terminal 116 (ground terminal) of a ground potential GND.

The input terminal A of the inverter I2 (output terminal of the inverter I1) is connected to the drain of the transistor T2.

The gate of the transistor T2 is connected to an input terminal 111 of a comparison voltage Vin. The source of the transistor T2 is connected to the drain of the transistor T3. The source of the transistor T3 is connected to the connection terminal 116 of the ground potential GND. The input terminal of the inverter I3 is connected to the input terminal A of the inverter I2. The output terminal of the inverter I3 is connected to the gate of the transistor T3.

The input terminal B of the inverter I1 (output terminal of the inverter I2) is connected to the drain of the transistor T4. The gate of the transistor T4 is connected to an input terminal 112 of a reference voltage Vref. The source of the transistor T4 is connected to the drain of the transistor T5. The source of the transistor T5 is connected to the connection terminal 116 of the ground potential GND. The input terminal of the inverter I4 is connected to the input terminal B of the inverter I1. The output terminal of the inverter I4 is connected to the gate of the transistor T5.

The transistors T2 and T3 and inverter I3 form an input circuit 123 (first input circuit) on the comparison voltage Vin side. The transistors T4 and T5 and inverter I4 form an input circuit 124 (second input circuit) on the reference voltage Vref side.

The input terminal B of the inverter I1 (output terminal of the inverter I2) is connected to an output terminal 113 of an output Vout of the voltage comparator 101.

The transistor T6 is connected between the input terminal A of the inverter I2 and the connection terminal 116 of the ground potential GND. The transistor T7 is connected between the input terminal B of the inverter I1 and the ground potential GND. The gates of the transistors T6 and T7 are connected to the input terminal 114 of the control signal TC.

The transistor T6 forms a reset circuit 125 (first reset circuit). The transistor T7 forms a reset circuit 126 (second reset circuit).

Figure 2:
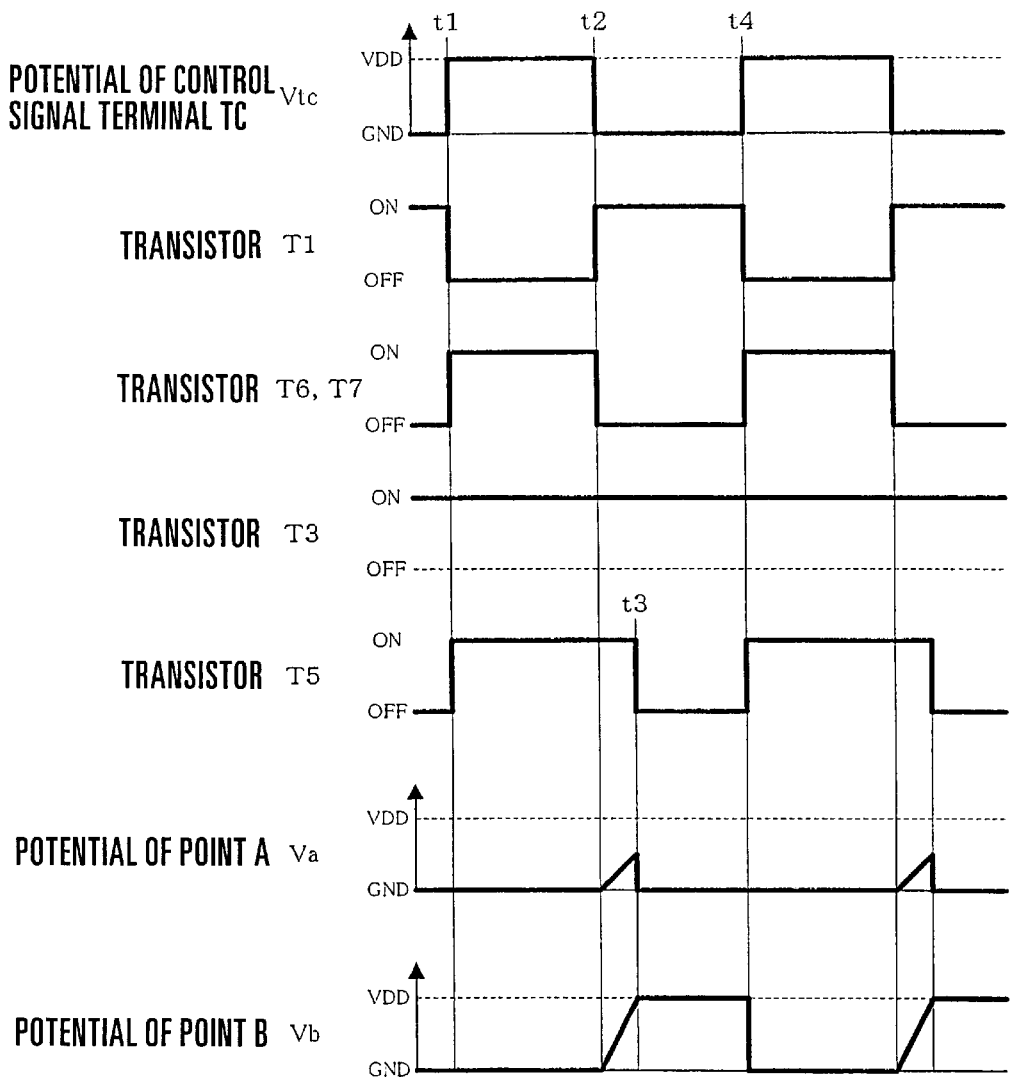
FIG. 2 is a timing chart showing operation of the voltage comparator 101.

Operation of the voltage comparator 101 will be described next with reference to FIG. 2. FIG. 2 shows operation of the voltage comparator 101.

At time t1, when the control signal TC is controlled to the power supply voltage VDD level to start the initialization period, the transistor T1 is turned off, and the transistors T6 and T7 are turned on. The input terminals A and B of the inverters I2 and I1 are discharged via the transistors T6 and T7, and potentials Va and Vb of these input terminals become the ground potential GND.

Since the input terminals A and B of the inverters I2 and I1 are at the ground potential GND, the output signals from the inverters I3 and I4 are set at the power supply voltage VDD level to turn on the transistors T3 and T5.

In the comparison operation, potentials for turning on the transistors T2 and T4 are supplied as the comparison voltage Vin and reference voltage Vref. Since the transistor T1 is OFF, no current flows to the voltage comparator 101, and the voltage comparator 101 does not operate. This state is the initial state.

At time t2, when the control signal TC is controlled to the ground potential GND level to start the comparison operation period, the transistor T1 is turned on, and the transistors T6 and T7 are turned off. A current flows to the transistors T11, T21, T12, and T22. The inverters I1 and I2 operate to form the positive feedback path of the positive feedback circuit.

At this time, the current flows through the path of the power supply voltage VDD→transistor T1→T11→T2→T3→ground potential GND and the path of the power supply voltage VDD→transistor T1→T21→T4→T5→ground potential GND, so the potentials Va and Vb of the input terminals A and B rise.

The transistors T2 and T4 have different ON resistances depending on the difference between the comparison voltage Vin and reference voltage Vref. For this reason, one of the potentials Va and Vb which has a higher ON resistance becomes high.

For example, as shown in FIG. 2, when comparison voltage Vin>reference voltage Vref, the ON resistance of the transistor T4 is higher than that of the transistor T2, and the potential Vb is higher than the potential Va.

Since the inverters I1 and I2 have the relationship of positive feedback, the small potential difference between the input terminals A and B is amplified. When the difference between the potentials Va and Vb becomes large to some degree, i.e., at time t3, the positive feedback path operates to set one of the potentials Va and Vb at the power supply voltage VDD level and the other at the ground potential GND level.

For one of the input terminals A and B, which has the potential Va or Vb equal to the power supply voltage VDD, the path of the power supply voltage VDD→transistor T1→T21→T4→T5 →ground potential GND or the path of the power supply voltage VDD→transistor T1→T11→T2→T3→ground potential GND is formed. However, since the output from the inverter I3 or I4 on the same side as that of the potential Va or Vb equal to the power supply voltage VDD is at the ground potential GND, the transistor T3 or T4 is turned off, and the DC current flowing the path is cut.

Referring to FIG. 2, at time t3, the difference between the potentials Va and Vb becomes large to some degree. This potential difference is amplified to set the lower potential Va at the ground potential GND and the higher potential Vb at the power supply potential VDD.

The potential Va becomes the output Vout from the voltage comparator 101, and the power supply voltage VDD representing comparison voltage Vin>reference voltage Vref is output from the output terminal 113.

According to the voltage comparator 101, the comparison voltage input terminal Vin and the output terminal A are disconnected by the transistor T2, and the reference voltage input terminal Vref and the output terminal B are disconnected by the transistor T4. Hence, kickback noise generated in the positive feedback type voltage comparator can be prevented. Additionally, high-speed operation and low power consumption can be simultaneously realized.

After that, to perform a new voltage comparison operation, at time t4, the control signal TC is controlled to set the entire voltage comparator 101 in the initial state.

At time t4, when the control signal TC is at the power supply voltage VDD, the transistor T1 is turned off to stop power supply to the inverters I1 and I2. The input terminals Va and Vb are in the floating state.

However, when the control signal TC changes to the power supply voltage VDD, the transistors T6 and T7 are turned on, so the potentials Va and Vb are reduced to the ground potential GND via the transistors T6 and T7.

Since the sufficiently high power supply voltage VDD is supplied to the gates of the transistors T6 and T7 as the control signal TC, the transistors T6 and T7 normally have sufficiently lower ON resistances than those of the transistors T2 and T4 having gates to which the comparison voltage Vin and reference voltage Vref lower than the power supply voltage VDD are supplied.

As compared to a case wherein the potentials Va and Vb are reduced via the transistors T2 and T4, the potentials Va and Vb can be reliably reduced to the ground potential GND via the transistors T6 and T7 in a short time.

Figure 3:
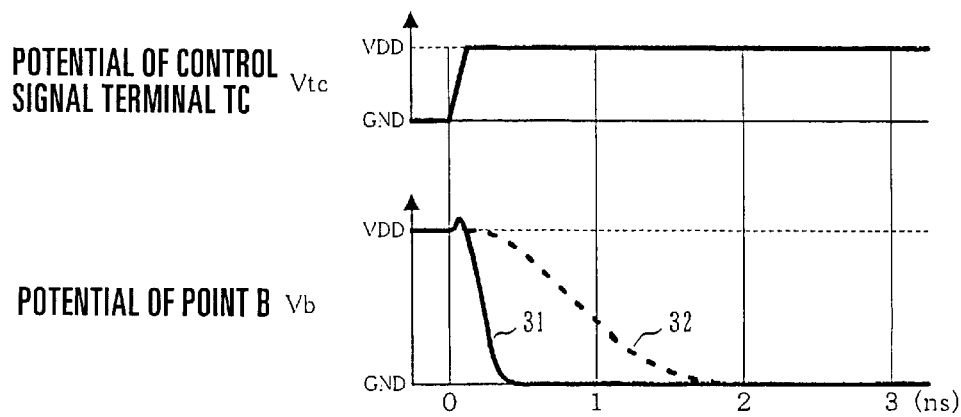
FIG. 3 is a waveform chart showing the discharge process of a potential Vb.
Figure 7:
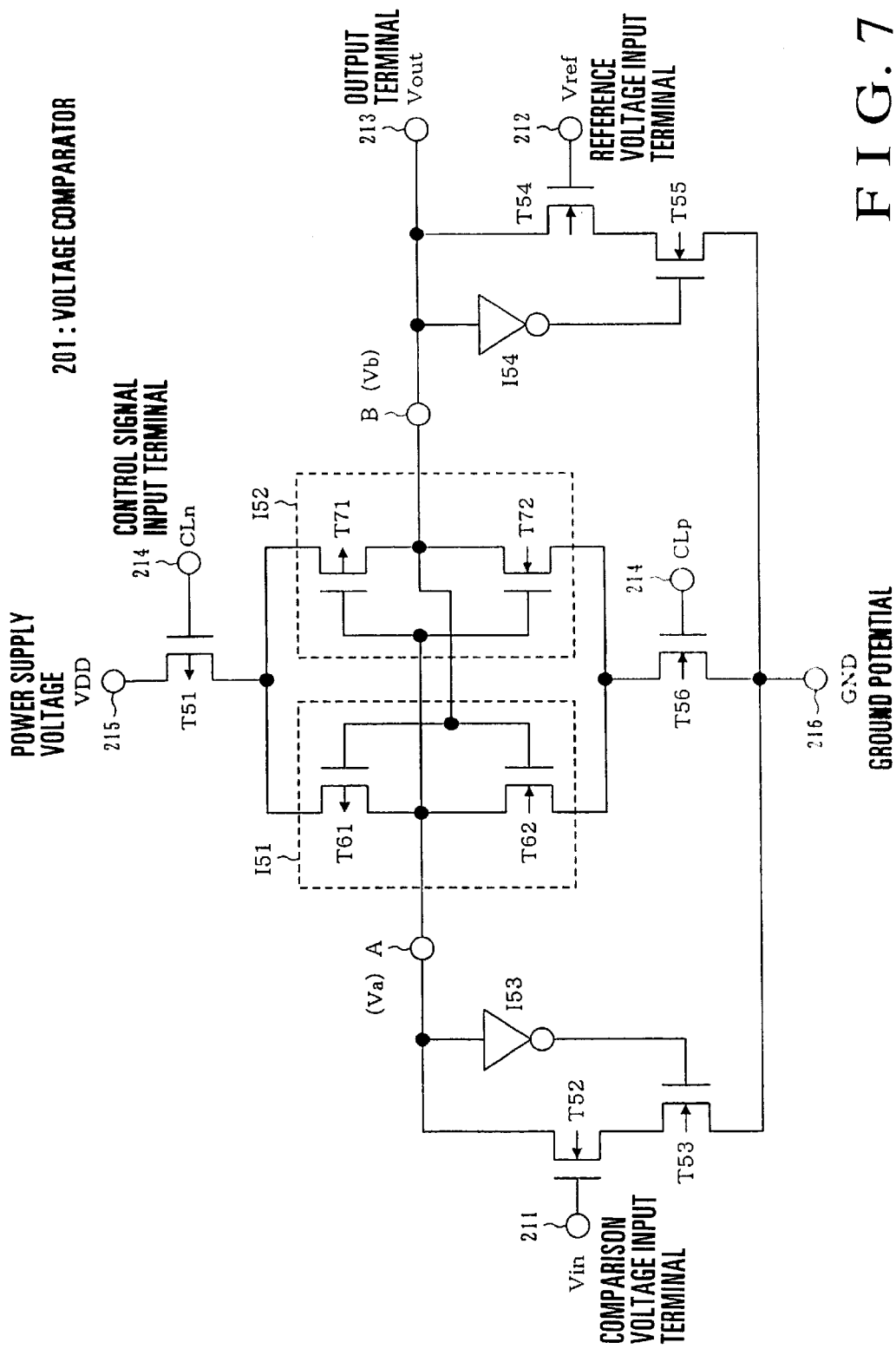
FIG. 7 is a circuit diagram showing a conventional voltage comparator 201.

FIG. 3 shows the discharge process of the potential Vb. A waveform 31 shows a change in potential Vb when the terminal is discharged via the transistor T7 by applying the present invention. A waveform 32 shows a change in potential Vb when the terminal is discharged via the transistor T7 (FIG. 7) as in the prior art.

As is apparent from FIG. 3, in the conventional waveform 32, the potential Vb is reduced to the ground potential GND with a large delay (about 2 ns in this example) from the leading edge of the control signal TC. However, according to the waveform 31 of the present invention, the potential Vb is reduced to the ground potential GND with little delay (about 0.5 ns in this example) from the leading edge of the control signal TC.

According to the present invention, the time after the control signal TC is risen until the potentials Va and Vb are reduced to the ground potential GND level, i.e., the time required for preparation for the next voltage comparison operation can be greatly shortened, and the voltage comparison operation can be repeatedly performed at a very short time interval.

In this embodiment, the P-channel MOSFET T1 may be replaced with an N-channel MOSFET, and the N-channel MOSFETs T2 to T7 may be replaced with P-channel MOSFETs.

The second embodiment of the present invention will be described next with reference to FIG. 4.

Figure 4:
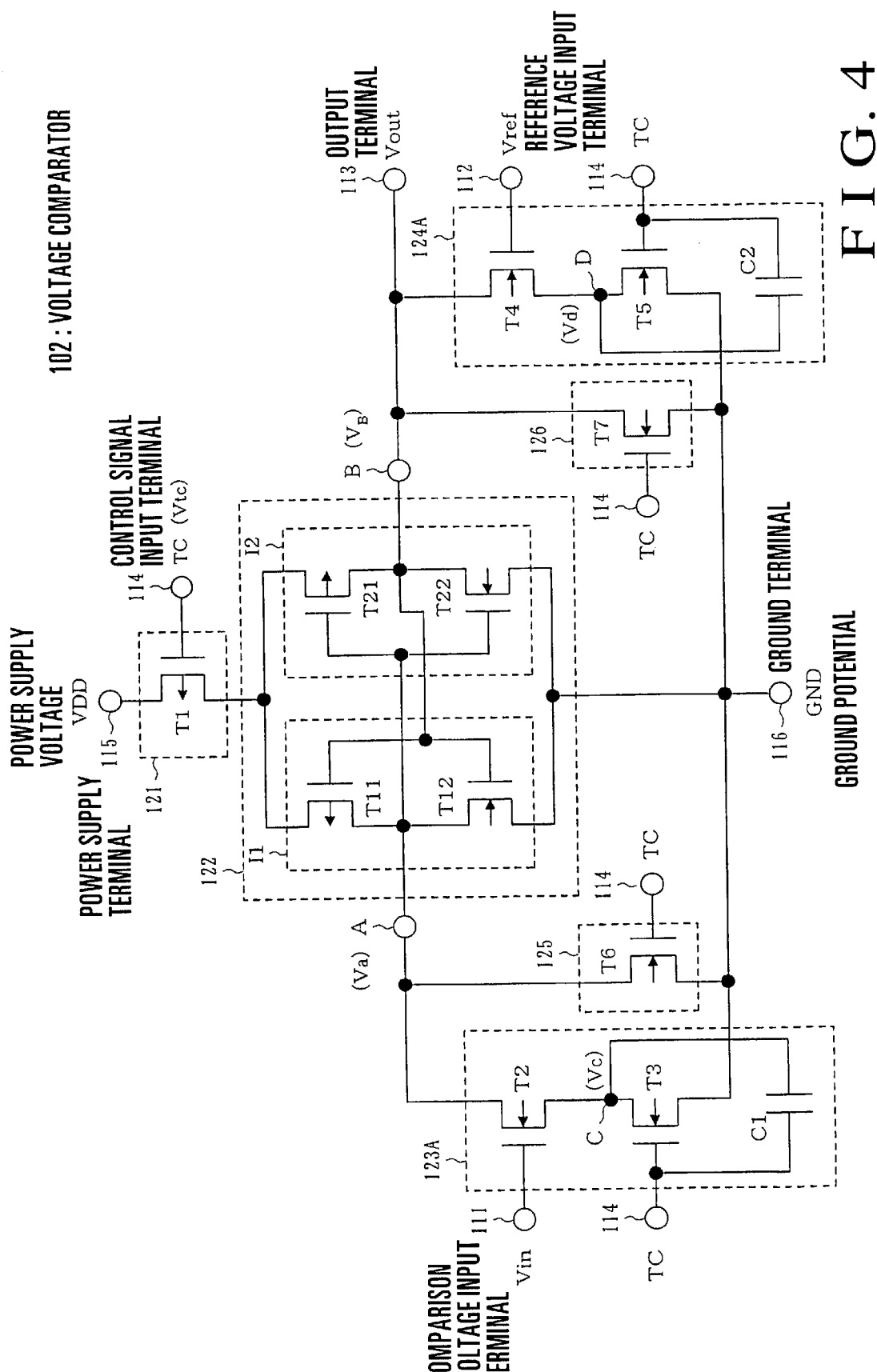
FIG. 4 is a circuit diagram showing a voltage comparator 102 according to the second embodiment of the present invention.

FIG. 4 shows a voltage comparator 102 according to the second embodiment of the present invention. In the voltage comparator 101 according to the first embodiment (FIG. 1), when the reference voltage Vref and input voltage Vin are equal to or lower than the threshold voltage Vth, the transistors T2 and T4 are always turned off. Hence, a reference voltage Vref and input voltage Vin between the ground potential GND level to the threshold voltage Vth cannot be compared.

The voltage comparator 102 of this embodiment is different from the voltage comparator 101 of the first embodiment in the following points. A capacitive element C1 is inserted between the source of a transistor T2 and the gate of a transistor T3, the inverter I3 is omitted, and the gate of the transistor T3 is connected to a connection terminal 114 of a control signal TC. In addition, a capacitive element C2 is inserted between the source of a transistor T4 and the gate of a transistor T5, the inverter I4 is omitted, and the gate of the transistor T5 is connected to the connection terminal 114 of the control signal TC.

The transistors T2 and T3 and capacitive element C1 form an input circuit 123A (first input circuit) on a comparison voltage Vin side. The transistors T4 and T5 and capacitive element C2 form an input circuit 124A (second input circuit) on a reference voltage Vref side.

Figure 5:
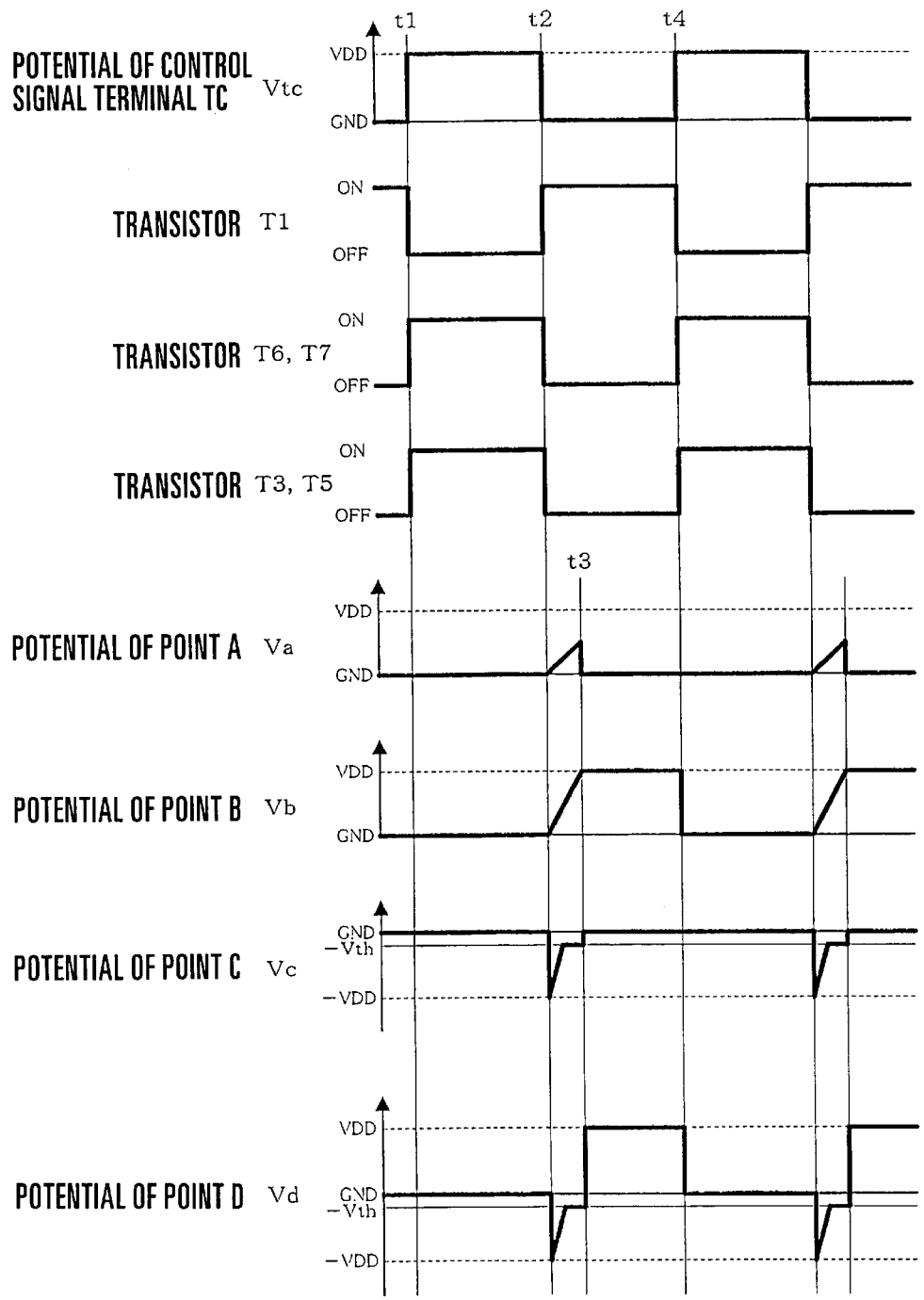
FIG. 5 is a timing chart showing operation of the voltage comparator 102.

Operation of the voltage comparator 102 will be described next with reference to FIG. 5. FIG. 5 shows operation of the voltage comparator 102.

At time t1, when the control signal TC is controlled to a power supply voltage VDD level to start the initialization period, a transistor T1 is turned off, and transistors T6 and T7 are turned on. Potentials Va and Vb of input terminals A and B of inverters I2 and I1 are reduced to a ground potential GND via the transistors T6 and T7.

Since the control signal TC is at the power supply voltage VDD, the transistors T3 and T5 are turned on. A potential Vc of a connection point C between the transistor T2 and capacitive element C1 and a potential Vd of a connection point D between the transistor T4 and capacitive element C2 are at the ground potential GND level. Hence, changes corresponding to the power supply voltage VDD are stored across the capacitive elements C1 and C2.

In the comparison operation, potentials for turning on the transistors T2 and T4 are supplied as the comparison voltage Vin and reference voltage Vref, respectively. Since the transistor T1 is OFF, no current flows to the voltage comparator 102, and the voltage comparator 102 does not operate. This state is the initial state.

At time t2, when the control signal TC is controlled to the ground potential GND level to start the comparison operation period, the transistor T1 is turned on, and the transistors T6 and T7 are turned off. A current flows to transistors T11, T21, T12, and T22. The inverters I1 and I2 operate to form the positive feedback path of a positive feedback circuit.

At this time, the transistors T3 and T5 are turned off. Since the potentials Vc and Vd at the ground potential GND level in the initial state are temporarily reduced to the −VDD level by the bootstrap function of the capacitive elements C1 and C2 because the control signal TC is at the ground potential GND level.

In the transistor T3, the potential of the terminal on the connection point C side becomes lower than that of the terminal on the ground potential GND side, and the terminal on the connection point C side serves as a source. For this reason, a forward p-n junction is formed between the connection point C and the substrate. The potential Vc of the connection point C is reduced to a forward ON voltage Vth of the PN junction via the p-n junction. The transistor T5 operates in the same way, and the potentials Vc and Vd are held at −Vth.

The potentials of the connection points C and D, i.e., the source potentials of the transistors T2 and T4 are −Vth. For this reason, when the gate potentials are almost at the ground potential GND level, the transistors T2 and T4 are turned on.

Even when the comparison voltage Vin and reference voltage Vref close to the ground potential GND level are input, the current flows to the path of the power supply voltage VDD→transistor T1→T11→T2→capacitive element C1 (−Vth) and the path of the power supply voltage VDD→transistor T1→T21→T4→capacitive element C2 (−Vth), and the potentials Va and Vb of the input terminals A and B rise.

The transistors T2 and T4 have different ON resistances depending on the difference between the comparison voltage Vin and reference voltage Vref. For this reason, one of the potentials Va and Vb which has a higher ON resistance becomes high.

For example, as shown in FIG. 5, when comparison voltage Vin>reference voltage Vref, the ON resistance of the transistor T4 is higher than that of the transistor T2, and the potential Vb is higher than the potential Va.

Since the inverters I1 and I2 have the relationship of positive feedback, the small potential difference between the input terminals A and B is amplified. When the difference between the potentials Va and Vb becomes large to some degree, i.e., at time t3, the positive feedback path operates to set one of the potentials Va and Vb at the power supply voltage VDD level and the other at the ground potential GND level.

For one of the input terminals A and B, which has the potential Va or Vb equal to the power supply voltage VDD, the path of the power supply voltage VDD→transistor T1→T21→T4→capacitive element C1 or the path of the power supply voltage VDD→transistor T1→T11→T2→capacitive element C2 is formed. However, when the connection point C or connection point D is charged to the power supply voltage VDD level, the charge current does not flow.

Referring to FIG. 5, at time t3, the difference between the potentials Va and Vb becomes large to some degree. This potential difference is amplified to set the lower potential Va at the ground potential GND and the higher potential Vb at the power supply potential VDD.

The potential Vb is an output Vout of the voltage comparator 102, and the power supply voltage VDD level representing comparison voltage Vin>reference voltage Vref is output from an output terminal 113.

According to the voltage comparator 102, the comparison voltage input terminal Vin and the output terminal A are disconnected by the transistor T2, and the reference voltage input terminal Vref and the output terminal B are disconnected by the transistor T4. Hence, kickback noise generated in the positive feedback type voltage comparator can be prevented. Additionally, high-speed operation and low power consumption can be simultaneously realized.

After that, to perform a new voltage comparison operation, at time t4, the control signal TC is controlled to set the entire voltage comparator 102 in the initial state.

At time t4, when the control signal TC is at the power supply voltage VDD, the transistors T3 and T5 are turned on, and the potentials Vc and Vd of the connection points C and D are set at the ground potential GND level.

In addition, the transistor T1 is turned off to stop power supply to the inverters I1 and I2. The input terminals Va and Vb are in the floating state.

However, when the control signal TC changes to the power supply voltage VDD, the transistors T6 and T7 are turned on, so the potentials Va and Vb are reduced to the ground potential GND via the transistors T6 and T7.

Since the sufficiently high power supply voltage VDD is supplied to the gates of the transistors T6 and T7 as the control signal TC, the transistors T6 and T7 normally have sufficiently lower ON resistances than those of the transistors T2 and T4 having gates to which the comparison voltage Vin and reference voltage Vref lower than the power supply voltage VDD, e.g., close to the ground potential GND level are supplied.

As compared to a case wherein the potentials Va and Vb are reduced via the transistors T2 and T4, the potentials Va and Vb can be reliably reduced to the ground potential GND via the transistors T6 and T7 in a short time.

According to the second embodiment, as in the first embodiment, the voltage comparison operation can be repeated at a very short time interval. In addition, even when the comparison voltage Vin or reference voltage Vref is equal to or lower than the threshold voltage Vth of the NMOSFET, the voltages can be accurately compared, resulting in a large increase in dynamic range of the voltage comparator. As the voltage comparator 102, particularly, when a voltage comparator that has a threshold voltage of about 0.5 V and operates at a power supply voltage of 1 V or less is formed by the existing CMOS process, an input dynamic range twice or more that of a conventional circuit can be ensured.

Unlike the first embodiment, only one of the input circuits 123A and 124A of this embodiment may be used, as needed. When this arrangement is applied to the conventional voltage comparator 201 shown in FIG. 7, voltages can be accurately compared even when the comparison voltage Vin or reference voltage Vref is equal to or lower than the threshold voltage Vth of the NMOSFET, and the dynamic range of the voltage comparator can be largely increased.

The third embodiment of the present invention will be described next with reference to FIG. 6.

Figure 6:
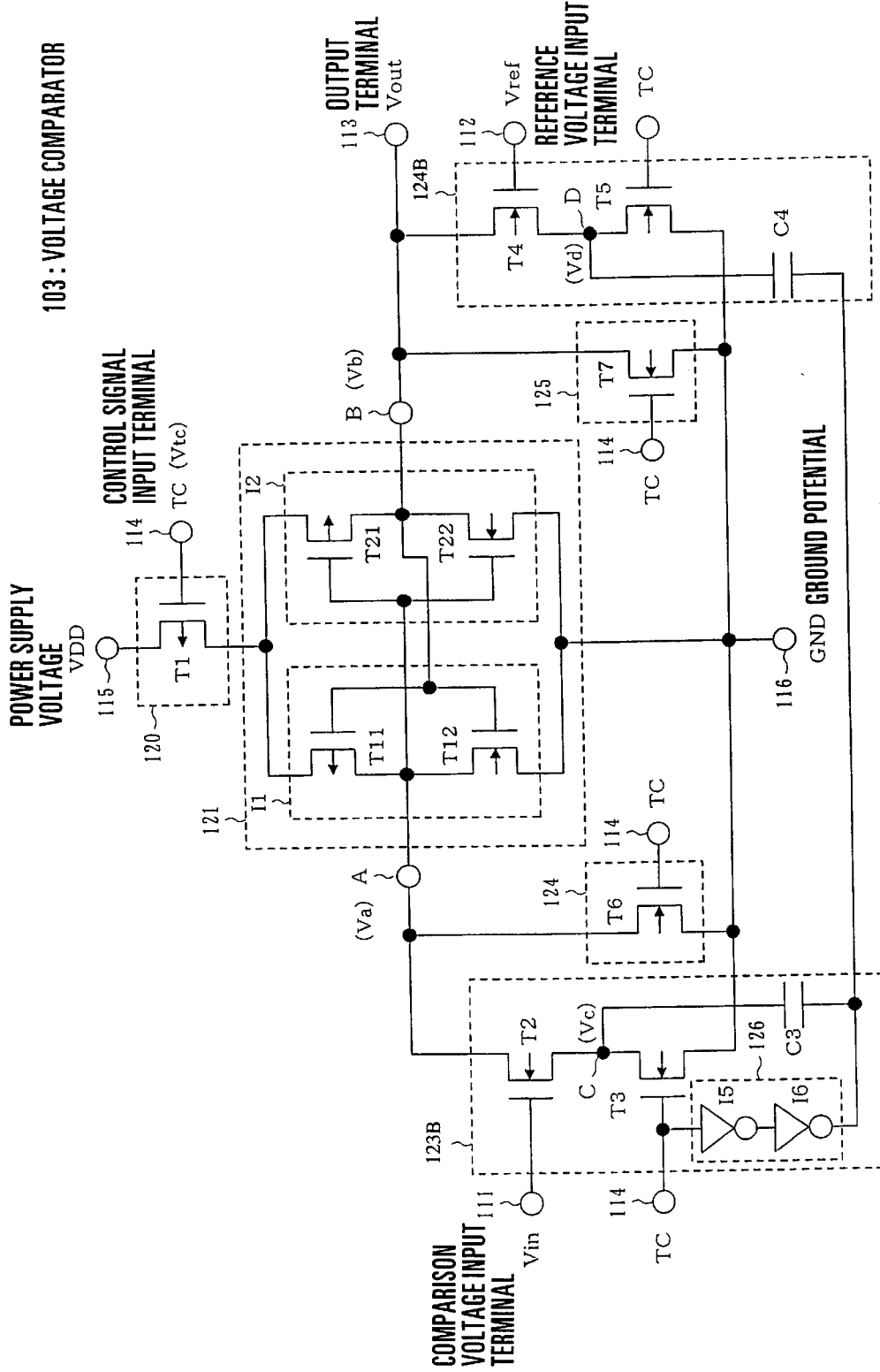
FIG. 6 is a circuit diagram showing a voltage comparator 103 according to the third embodiment of the present invention.

FIG. 6 shows a voltage comparator 103 according to the third embodiment of the present invention. In the voltage comparator 102 of the second embodiment (FIG. 4), the capacitive elements C1 and C2 are inserted between the connection points C and D and the control signal TC, respectively.

In the third embodiment, in place of the capacitive elements C1 and C2, capacitive elements C3 and C4 are inserted, and a buffer circuit 126 constituted by inverters I5 and I6 is used to drive the capacitive elements C3 and C4.

The input of the inverter I5 is connected to a connection terminal 114 of a control signal TC. The output of the inverter I5 is connected to the input of the inverter I6. The output of the inverter I6 is connected to one terminal of each of the capacitive elements C3 and C4. The other terminal of each of the capacitive elements C3 and C4 is connected to a corresponding one of connection points C and D.

Transistors T2 and T3, capacitive element C3, and buffer circuit 126 form an input circuit 123B (first input circuit) on a comparison voltage Vin side. Transistors T4 and T5, capacitive element C4, and buffer circuit form an input circuit 124B (second input circuit) on a reference voltage Vref side. As in the voltage comparator 102 according to the above-described second embodiment, a signal in phase with the control signal TC is supplied to the capacitive elements C3 and C4, and the same operation as in FIG. 5 is performed.

Hence, as in the second embodiment, even when the comparison voltage Vin or reference voltage Vref is equal to or lower than a threshold voltage Vth of the NMOSFET, the voltages can be accurately compared, and the dynamic range of the voltage comparator can be greatly increased. In addition, the capacitive elements C3 and C4 are disconnected from the input terminal 114 of the control signal TC by the inverters I5 and I6. For this reason, the input load when viewed from the control signal terminal TC can be reduced in the voltage comparator 103 of the third embodiment, the capacitive elements C3 and C4 can be driven at low impedance, and an accurate and high-speed comparison operation can be realized.

Unlike the first embodiment, only one of the input circuits 123B and 124B of this embodiment may be used, as needed. When this arrangement is applied to the conventional voltage comparator 201 shown in FIG. 7, the dynamic range of the voltage comparator can be largely increased, and an accurate and high-speed comparison operation can be realized, as described above.

As has been described above, according to the present invention, the first reset circuit is inserted between the ground terminal and the input terminal of the second inverter forming the positive feedback circuit, and the second reset circuit is inserted between the ground terminal and the input terminal of the first inverter forming the positive feedback circuit. When the control signal represents the initialization period, the first and second reset circuits are operated to reduce the first potential of the input terminal of the second inverter and the second potential of the input terminal of the first inverter to the ground potential. With this arrangement, the time after the initialization period starts until the first and second potentials are reduced to the ground potential, i.e., the time required to prepare for the next voltage comparison operation can be largely shortened. Hence, the voltage comparison operation can be repeatedly performed at a very short time interval.

What is claimed is:

1. A voltage comparator comprising:

a positive feedback circuit having first and second inverters each having an input terminal connected to an output terminal of the other inverter, said positive feedback circuit comparing a potential of an input terminal of said first inverter with a potential of an input terminal of said second inverter and outputting the comparison result from an output terminal of said second inverter;

a first input circuit for supplying the first potential corresponding to an input comparison voltage to the input terminal of said second inverter;

a second input circuit for supplying the second potential corresponding to an input reference voltage to the input terminal of said first inverter;

a control circuit connected between a power supply terminal of said positive feedback circuit and a power supply terminal, said control circuit supplying a power supply voltage to said positive feedback circuit when an input control signal represents a comparison operation period to execute voltage comparison operation for comparing the first potential with the second potential by said positive feedback circuit, and stopping supplying the power supply voltage to set an initial state when the control signal represents an initialization period;

a first reset circuit inserted between the input terminal of said second inverter and a ground terminal to reduce the first potential to a ground potential when the control signal represents the initialization period; and a second reset circuit inserted between the input terminal of said first inverter and the ground terminal to reduce the second potential to the ground potential when the control signal represents the initialization period.

2. A comparator according to claim 1, wherein said control circuit is connected between said positive feedback circuit and the power supply terminal and has a first MOSFET having a gate to which the control signal is supplied.

3. A comparator according to claim 1, wherein said first reset circuit is connected between the input terminal of said second inverter and the ground terminal and has a MOSFET having a gate to which the control signal is supplied.

4. A comparator according to claim 1, wherein said second reset circuit is connected between the input terminal of said first inverter and the ground terminal and has a MOSFET having a gate to which the control signal is supplied.

5. A comparator according to claim 1, wherein said first input circuit has a third inverter having an input connected to the input terminal of said second inverter, and a second MOSFET and third MOSFET series-connected between the input terminal of said second inverter and the ground terminal, the comparison voltage is supplied to a gate of said second MOSFET, and an output of said third inverter is connected to a gate of said third MOSFET.

6. A comparator according to claim 1, wherein said second input circuit has a fourth inverter having an input connected to the input terminal of said first inverter, and a fourth MOSFET and fifth MOSFET series-connected between the input terminal of said first inverter and the ground terminal, the reference voltage is supplied to a gate of said fourth MOSFET, and an output of said fourth inverter is connected to a gate of said fifth MOSFET.

7. A comparator according to claim 1, wherein said first input circuit has a second MOSFET and third MOSFET series-connected between the input terminal of said second inverter and the ground terminal, and a first capacitive element connected between a connection point of said second and third MOSFETs and a gate of said third MOSFET, the comparison voltage is supplied to a gate of said second MOSFET, and the control signal is supplied to the gate of said third MOSFET.

8. A comparator or according to claim 1, wherein said second input circuit has a fourth MOSFET and fifth MOSFET series-connected between the input terminal of said first inverter and the ground terminal, and a second capacitive element connected between a connection point of said fourth and fifth MOSFETs and a gate of said fifth MOSFET, the reference voltage is supplied to a gate of said fourth MOSFET, and the control signal is supplied to the gate of said fifth MOSFET.

9. A comparator according to claim 1, wherein said first input circuit has a second MOSFET and third MOSFET series-connected between the input terminal of said second inverter and the ground terminal, a buffer circuit having an input to which the control signal is supplied, and a third capacitive element connected between a connection point of said second and third MOSFETs and an output of said buffer circuit, the comparison voltage is supplied to a gate of said second MOSFET, and the control signal is supplied to the gate of said third MOSFET.

10. A comparator according to claim 1, wherein said second input circuit has a fourth MOSFET and fifth MOSFET series-connected between the input terminal of said first inverter and the ground terminal, a buffer circuit having an input to which the control signal is supplied, and a fourth capacitive element connected between a connection point of said fourth and fifth MOSFETs and an output of said buffer circuit, the reference voltage is supplied to a gate of said fourth MOSFET, and the control signal is supplied to the gate of said fifth MOSFET.

* * * * *